United States Patent [19]

Uemura et al.

[11] Patent Number: 4,984,062
[45] Date of Patent: Jan. 8, 1991

[54] PACKAGED SEMICONDUCTOR DEVICE

[75] Inventors: Shunichi Uemura; Toshinobu Banjo, both of Itami, Japan

[73] Assignee: Mitsubishi Denki Kabushiki Kaisha, Japan

[21] Appl. No.: 346,390

[22] Filed: May 3, 1989

Related U.S. Application Data

[63] Continuation of Ser. No. 154,321, Feb. 10, 1988, abandoned.

[30] Foreign Application Priority Data

Mar. 30, 1987 [JP] Japan .................................. 62-77136

[51] Int. Cl.$^5$ ............................................. H01L 23/48
[52] U.S. Cl. ......................................... 357/70; 357/69
[58] Field of Search ...................................... 357/70, 69

[56] References Cited

U.S. PATENT DOCUMENTS 4,514,750 4/1985 Adams .................................. 357/70

FOREIGN PATENT DOCUMENTS

| 157685 | 10/1985 | European Pat. Off. | 357/70 |
| 54-144872 | 11/1979 | Japan | 357/70 |
| 55-48954 | 4/1980 | Japan | 357/70 |
| 59-200449 | 11/1984 | Japan | 357/70 |
| 59-219952 | 12/1984 | Japan | 357/70 |
| 247063 | 11/1986 | Japan | 357/70 |

*Primary Examiner*—Rolf Hille
*Assistant Examiner*—Steven Loke
*Attorney, Agent, or Firm*—Leydig, Voit & Mayer

[57] ABSTRACT

A packaged semiconductor device includes a resin package having a rectangular shape, a semiconductor device contained in the resin package and having a plurality of terminals oriented along the shorter sides of the resin package, a plurality of leads located in the vicinity of the terminals of the semiconductor device and extending outwardly from the shorter sides of the resin package generally parallel to the longer sides, and a plurality of lead wires respectively connecting each of the plurality of terminals of the semiconductor device to one of the plurality of leads.

5 Claims, 3 Drawing Sheets

PACKAGED SEMICONDUCTOR DEVICE

This application is a continuation of application Ser. No. 154,321 filed Feb. 10, 1988, abandoned.

BACKGROUND OF THE INVENTION

The present to a semiconductor device with package in which a semiconductor device is packaged in a resin.

FIG. 1 shows the internal structure of a known packaged semiconductor device of the type which is disclosed in, for example, the specification of U.S. Pat. No. 4,514,750. The packaged semiconductor device includes a semiconductor 2, a rectangular pad 1 for positioning the semiconductor device 2, terminals 3 of the semiconductor device 2 which are positioned on the shorter sides of the rectangular shape of the pad 1, leads 4 consisting of inner leads 4a and outer leads 4b, wires 5 connecting the leads 4 to the semiconductor device 2 placed on the pad 1, pad leads 6 for supporting the pad 1 to the outer frame (not shown) of a lead frame until the assembly of the semiconductor device into a package is completed, and a resin package A for sealing the semiconductor device 2 and the inner leads 4a. FIGS. 2A and 2B are plan and side elevational views of the semiconductor device with package of FIG. 1, respectively.

In assemblying the thus-arranged packaged semiconductor device, the semiconductor device 2 is bonded onto the pad 1, the terminals 3 of the semiconductor device 2 are connected to the corresponding inner leads 4a by the wires 5, and thereafter the semiconductor device 2 and the inner leads 4a are packaged in a resin.

However, the above-described type of known packaged semiconductor device has a disadvantage in that the size of the external shape of the package A cannot be reduced. The location of the outer leads 4b on the longer sides of the rectangular package A, prevents the desired reduction of package size in response to the recent demands for high-density assembly on a printed circuit board (not shown). In other words, in the packaged semiconductor device of this type, all the inner leads 4a must be located in the vicinity of the terminals 3 of the semiconductor device 2, and it is therefore necessary for parts of the leads 4 to be extended on the shorter sides of the package A and then led to and projected from the longer sides. This prevents the packaged semiconductor device from being used in high density circuitry.

SUMMARY OF THE INVENTION

In view of the above-described disadvantage of the prior art, an object of this invention is to provide a packaged semiconductor device which enables the external size of a package to be reduced to ensure high density assembly thereof onto a printed circuit board or the like.

To achieve the above-described object, the present invention provides a packaged semiconductor device in which all the leads are parallel to the longer sides of a resin package inside and outside thereof and are exposed at the shorter sides thereof.

Since all the leads are disposed generally in parallel to the longer sides of the resin package inside and outside the resin package and are exposed at the shorter sides thereof according to the present invention, it is not necessary for the leads to be extended. This makes reduction in the external size of the package possible, ensuring high density assembly.

DESCRIPTION OF THE PREFERRED EMBODIMENT

Figure 1:
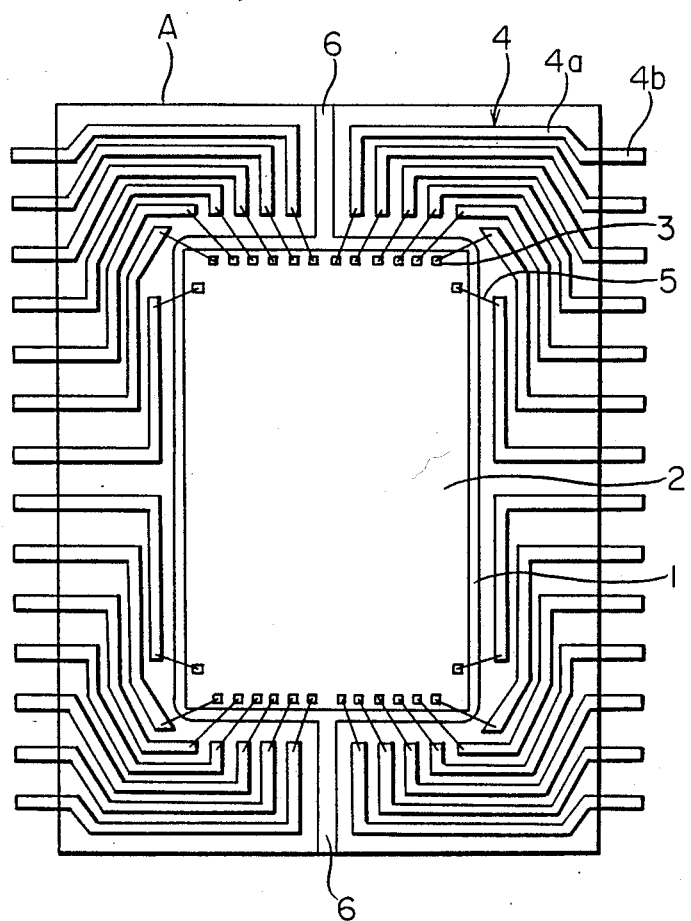
FIG. 1 illustrates the internal structure of a known packaged semiconductor device.
Figure 2A:
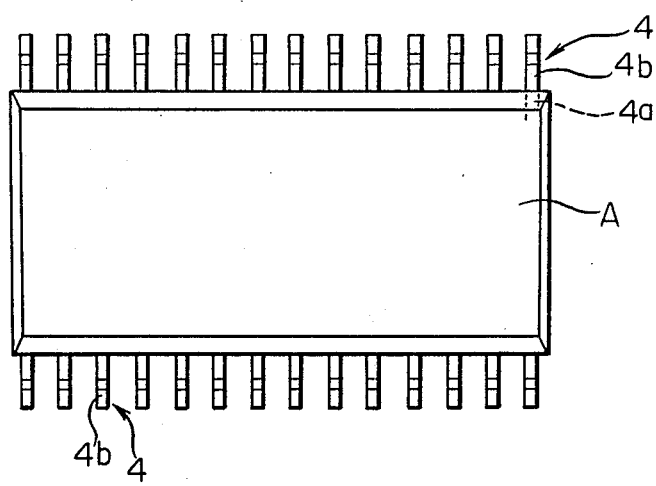
FIG. 2A is a plan elevational view of the semiconductor device with package of FIG. 1.
Figure 2B:
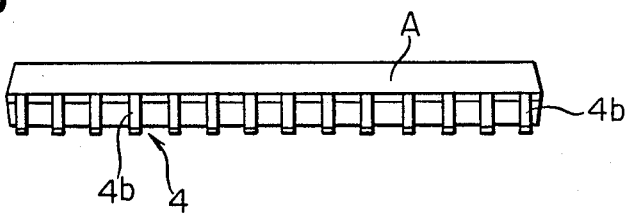
FIG. 2B is a side elevational view of the packaged semiconductor device of FIG. 1.
Figure 4A:
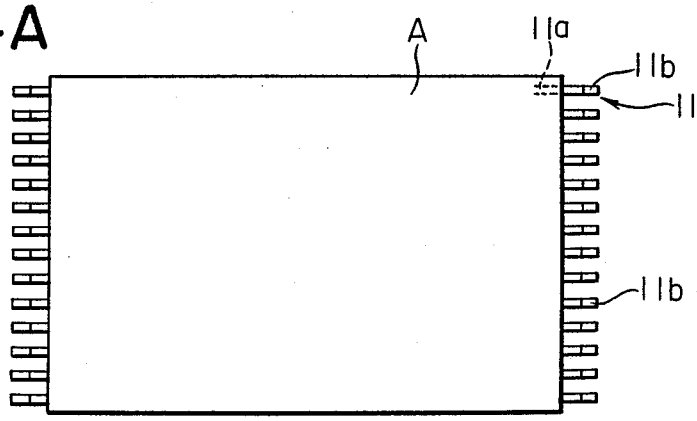
FIG. 4A is a plan elevational view of the packaged semiconductor device of FIG. 3.
Figure 4B:
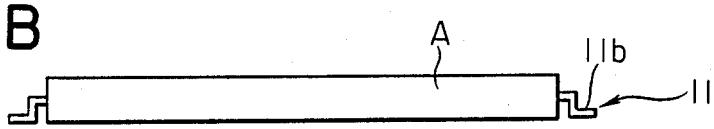
FIG. 4B is a side elevational view of the packaged semiconductor device of FIG. 3.
Figure 3:
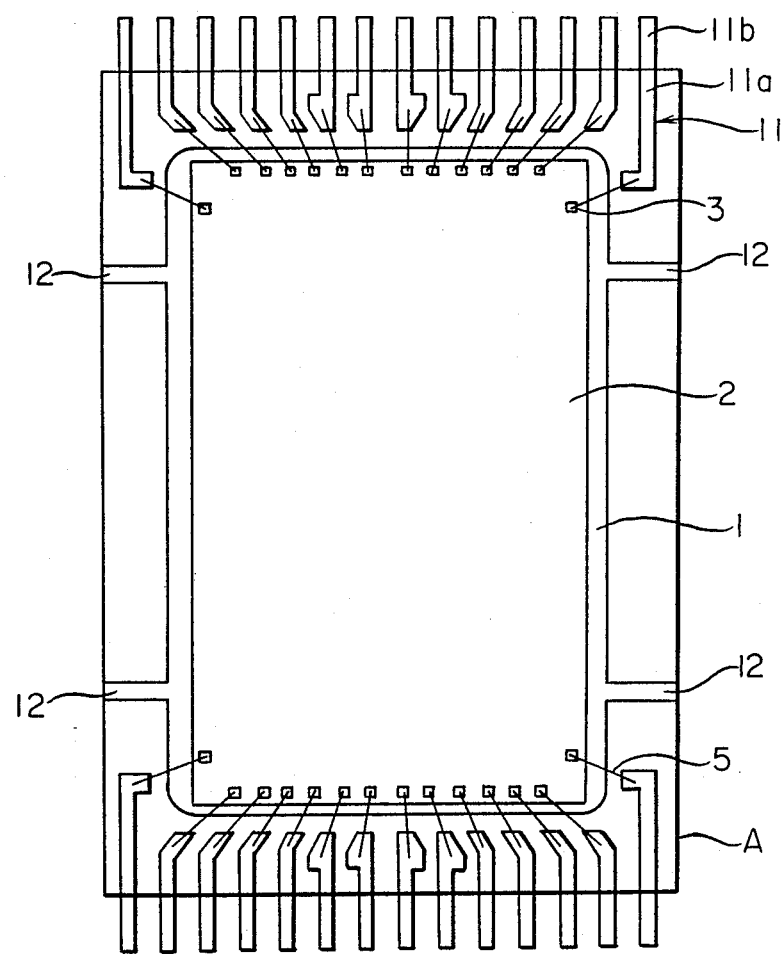
FIG. 3 illustrates the internal structure of a packaged semiconductor device, showing an embodiment of the present invention.

An embodiment of the present invention will be described below with reference to FIGS. 3, 4A, and 4B. Like reference numerals are used to denote parts corresponding to those shown in FIGS. 1, 2A, and 2B. Each lead 11 is comprised of an inner lead 11a and an outer lead 11b. The leads are formed substantially into an I-shape, and are disposed generally parallel to the longer sides of the resin package inside and outside thereof and in such a manner as to be exposed at the shorter sides. The pad leads 12 are for elastically supporting the pad 1 on the outer frame (not shown) of a lead frame until the assembly of the semiconductor device into the package is completed.

The packaged semiconductor device of this embodiment can be assembled in the same manner as in the prior art. More specifically, the semiconductor device 2 is bonded onto the pad 1, the terminals 3 of the semiconductor device 2 are connected to the inner leads 11a by the wires 5, and the semiconductor device 2 and the inner leads 11a are packaged in resin.

In the thus-arranged packaged semiconductor device, it is not necessary for all the inner leads 11a to be led around from the shorter sides of the package A and then extended to the longer sides thereof. This enables the size of the resin package A for sealing the semiconductor device 2 to be reduced, enabling the high density assembly thereof onto a printed circuit board or the like.

As will be understood from the foregoing description, since all the leads are parallel to the longer sides of the resin package both inside and outside thereof and are exposed at the shorter sides of the package according to the present invention, it is not necessary for the leads to be bent in order to extend from the shorter sides. It is therefore possible to reduce the size of the external shape of the package and ensure high density assembly.

What is claimed is:

1. A packaged semiconductor device comprising:
    a resin package having a generally rectangular shape with a pair of opposed longer sides and a pair of opposed shorter sides;
    a semiconductor device contained within said resin package, said semiconductor device having a plurality of terminals oriented along said shorter sides of said resin package;
    a pad to which said semiconductor device is bonded within said resin package;

a plurality of leads extending outwardly from the shorter sides of said resin package generally parallel to said longer sides, each lead having an inner end disposed within said package in the vicinity of one of said terminals;

a plurality of lead wires respectively connecting each of said plurality of terminals of said semiconductor device to one of said plurality of leads at said inner end within said resin package; and two pairs of pad leads extending from said pad for supporting said pad on a frame while said semiconductor device is being bonded to said pad during assembly of said packaged semiconductor device wherein said pad leads are disposed generally parallel to said shorter sides and extend to said longer sides of said packaged device.

2. The packaged semiconductor device according to claim 1 wherein said pad and semiconductor device are generally rectangular and respectively have a pair of opposed longer pad and device edges generally parallel to said pair of opposed longer sides of said resin package and a pair of opposed shorter pad and device edges generally parallel to said pair of opposed shorter sides of said resin package and each of said pairs of pad leads is disposed proximate a respective shorter pad edge for stabilizing said pad during assembly of said packaged semiconductor device.

3. A packaged semiconductor device comprising;

a resin package having a generally rectangular shape with a pair of opposed longer sides and a pair of opposed shorter sides;

a semiconductor device contained within said resin package, said semiconductor device having a plurality of terminals oriented along said shorter sides of said resin package;

a pad to which said semiconductor device is bonded within said resin package;

a plurality of leads extending outwardly from the shorter sides of said resin package generally parallel to said longer sides, each lead having an inner end disposed within said package in the vicinity of one of said terminals, at least one of said leads including a widened portion extending from said inner end toward one of said longer sides proximate the respective terminal, the widened portion being trapezoidal in shape and including a first edge generally parallel to said longer sides and a second edge, intersecting said first edge, diagonal to said longer and shorter sides wherein the inner end of the lead disposed adjacent said lead including a trapezoidal widened portion includes an inner end disposed generally parallel to and spaced from said second edge;

pad leads extending from said pad for supporting said pad on a frame while said semiconductor device is being bonded to said pad during assembly of said packaged semiconductor device wherein said pad leads are disposed generally parallel to said shorter sides and extend to said longer sides of said packaged device.

4. The packaged semiconductor device according to claim 3 including a plurality of leads having trapezoidal widened inner lead portions disposed proximate respective terminals along both shorter sides of said package.

5. The packaged semiconductor device according to claim 4 wherein the trapezoidal widened portions of two adjacent leads at one of said shorter sides are respectively disposed toward opposite ones of said longer sides.

* * * * *